(12) United States Patent
Kosaki et al.

(10) Patent No.: US 8,420,516 B2
(45) Date of Patent: Apr. 16, 2013

(54) METHOD FOR PRODUCING N-TYPE GROUP III NITRIDE SEMICONDUCTOR

(75) Inventors: Masayoshi Kosaki, Kiyosu (JP); Hiroshi Miwa, Kiyosu (JP)

(73) Assignee: Toyoda Gosei Co., Ltd., Kiyosu-Shi, Aichi-Ken (JP)

(*) Notice: Subject to any disclaimer, the term of this patent is extended or adjusted under 35 U.S.C. 154(b) by 47 days.

(21) Appl. No.: 13/067,549

(22) Filed: Jun. 8, 2011

(65) Prior Publication Data
US 2011/0306190 A1  Dec. 15, 2011

(30) Foreign Application Priority Data
Jun. 11, 2010  (JP) .................................. 2010-134507

(51) Int. Cl.
*H01L 21/311* (2006.01)
(52) U.S. Cl.
USPC ......................... 438/504; 438/916; 257/E21.1
(58) Field of Classification Search .................. 438/504, 438/916, FOR. 241; 257/E21.1
See application file for complete search history.

(56) References Cited

U.S. PATENT DOCUMENTS

| 6,682,991 | B1 * | 1/2004 | Hino et al. | 438/481 |
| 6,881,261 | B2 * | 4/2005 | Ueda | 117/89 |
| 7,399,687 | B2 * | 7/2008 | Hiramatsu et al. | 438/483 |
| 7,999,249 | B2 * | 8/2011 | Moteki et al. | 257/12 |
| 2004/0217375 | A1 * | 11/2004 | Yokogawa et al. | 257/192 |
| 2004/0238860 | A1 * | 12/2004 | Inoue et al. | 257/289 |
| 2005/0042788 | A1 * | 2/2005 | Ueda | 438/46 |
| 2010/0006876 | A1 * | 1/2010 | Moteki et al. | 257/95 |
| 2012/0056220 | A1 * | 3/2012 | Sato et al. | 257/94 |

FOREIGN PATENT DOCUMENTS
JP  2001-185499 A  7/2001

* cited by examiner

*Primary Examiner* — George Fourson, III
(74) *Attorney, Agent, or Firm* — McGinn IP Law Group, PLLC

(57) ABSTRACT

The present invention provides a method for producing an n-type Group III nitride semiconductor product having a high Si concentration and exhibiting favorable crystallinity. In the production method, specifically, an AlN buffer layer is formed on a sapphire substrate by MOCVD, and then a first layer (thickness: 2 μm) is formed from undoped GaN on the buffer layer by MOCVD at 1,140° C. Subsequently, a second layer (thickness: 200 nm) is formed from $SiO_2$ on the first layer by plasma CVD, and then the second layer is removed by use of BHF (buffered hydrofluoric acid). Next, a GaN layer (thickness: 50 nm) is grown, by MOCVD at 1,140° C., on the first layer exposed by removal of the second layer without supply of an n-type dopant gas. Thus, on the first layer is provided a third layer formed of n-type GaN doped with Si at a high concentration and exhibiting favorable crystallinity.

17 Claims, 2 Drawing Sheets

Reduction of resistance
(with a process of formation and removal of $SiO_2$ film before GaN regrowth)

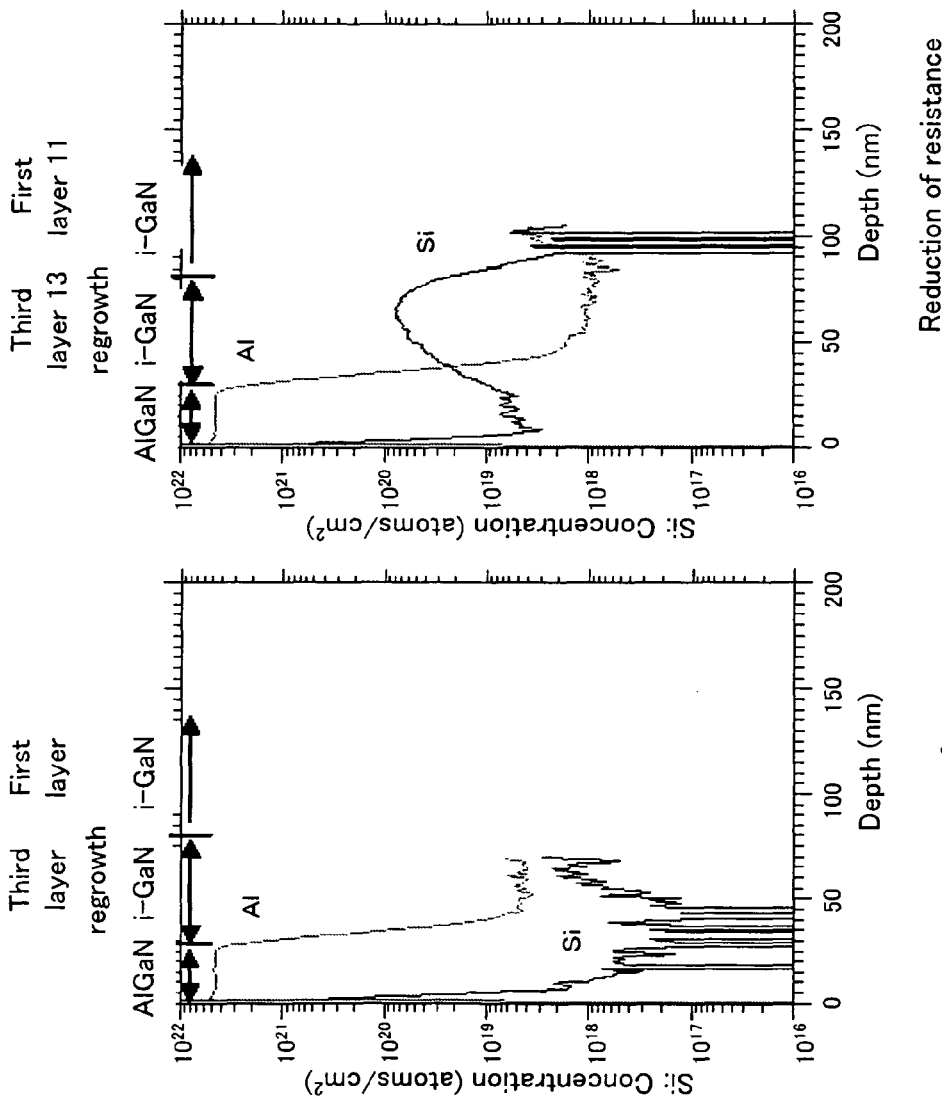

METHOD FOR PRODUCING N-TYPE GROUP III NITRIDE SEMICONDUCTOR

BACKGROUND OF THE INVENTION

1. Field of the Invention

The present invention relates to a method for producing an n-type Group III nitride semiconductor product doped with Si at a high concentration and exhibiting favorable crystallinity.

2. Background Art

In a conventional method for producing an n-type Group III nitride semiconductor product by MOCVD, a Group III nitride semiconductor is doped with Si by using silane ($SiH_4$) as a dopant gas (see, for example, Japanese Patent Application Laid-Open (kokai) No. 2001-185499).

However, in such a method for producing an n-type Group III nitride semiconductor product by use of silane dopant gas, the Si doping concentration is limited to a level on the order of $1 \times 10^{18}$ $cm^{-3}$, and Si doping at a higher concentration may cause impairment of crystallinity.

SUMMARY OF THE INVENTION

In view of the foregoing, an object of the present invention is to provide a method for producing an n-type Group III nitride semiconductor product doped with Si at a high concentration and exhibiting favorable crystallinity.

The present inventors have conducted studies on a technique for selective growth of GaN by use of an $SiO_2$ mask, and as a result have first found that when GaN is regrown after removal of $SiO_2$ by use of buffered hydrofluoric acid (BHF), the regrown GaN is doped with Si at a high concentration. The present invention has been accomplished on the basis of this finding, and realizes doping of a Group III nitride semiconductor with Si at a high concentration without causing impairment of the crystallinity of the semiconductor.

In the first aspect of the present invention, there is provided a method for producing an n-type Group III nitride semiconductor product, the method comprising, forming a second layer of $SiO_2$ on a first layer of a Group III nitride semiconductor; removing the second layer by wet etching; and growing a Group III nitride semiconductor on the first layer exposed by the removal of the second layer by MOCVD without supply of an n-type dopant gas, or with supply of an n-type dopant so that the Si concentration attributed to the n-type dopant is less than $1 \times 10^{19}/cm^3$, to thereby provide a third layer formed of an n-type Group III nitride semiconductor doped with Si at a concentration of $1 \times 10^{19}/cm^3$ or more.

As used herein, "Group III nitride semiconductor" encompasses a semiconductor represented by the formula $Al_xGa_y\text{-}In_zN$ ($x+y+z=1$, $0 \leq x, y, z \leq 1$); such a semiconductor in which a portion of Al, Ga, or In is substituted by another Group 13 element (i.e., B or Tl), or a portion of N is substituted by another Group 15 element (i.e., P, As, Sb, or Bi). Specific examples of the Group III nitride semiconductor include those containing at least Ga, such as GaN, InGaN, AlGaN, and AlGaInN.

The first layer and the third layer may have the same composition or different compositions. Each of the first layer and the third layer may be formed of a single layer or a plurality of layers.

The first layer may be formed of an n-type, p-type, or intrinsic Group III nitride semiconductor. Generally, Si is used as an n-type impurity, and Mg is used as a p-type impurity.

As used herein, the Si concentration of the third layer refers to the average (arithmetic mean) of Si concentrations as measured in a depth direction. Hereinafter, the expression "the average of Si concentrations as measured in a depth direction" may be referred to simply as "Si concentration." When the third layer has an average Si concentration of $1 \times 10^{19}/cm^3$ or more, a portion of the third layer (e.g., a portion in the vicinity of the surface thereof) may have an Si concentration of less than $1 \times 10^{19}/cm^3$.

The third layer preferably has a thickness greater than 0 nm and 50 nm or less. When the third layer has a thickness falling within this range, the third layer has an Si concentration of $1 \times 10^{19}/cm^3$ or more as measured at any point in a depth direction.

The second layer may be formed by, for example, plasma CVD, another CVD technique, or sputtering. When the second layer is formed by plasma CVD, the raw material gases employed may be, for example, silane ($SiH_4$) and $N_2O$.

Wet etching of the second layer may be carried out by use of a hydrofluoric acid etchant (in particular, buffered hydrofluoric acid (BHF)).

Only an intended portion of the second layer may be removed, and a Group III nitride semiconductor may be selectively grown on a region of the first layer corresponding to the removed portion of the second layer, to thereby form the n-type third layer only on the region.

The second layer may be formed only on an intended region of the first layer, and the third layer may be formed from undoped GaN on the first layer after removal of the second layer, so that only a portion of the third layer corresponding to the intended region is doped with Si and is of an n-type.

The second aspect of the present invention is drawn to a specific embodiment of the method for producing an n-type Group III nitride semiconductor product according to the first aspect of the invention, wherein the second layer is formed by plasma CVD.

The third aspect of the present invention is drawn to a specific embodiment of the method for producing an n-type Group III nitride semiconductor product according to the first or second aspect of the invention, wherein wet etching of the second layer is carried out by use of a hydrofluoric acid etchant.

The fourth aspect of the present invention is drawn to a specific embodiment of the method for producing an n-type Group III nitride semiconductor product according to the third aspect of the invention, wherein the hydrofluoric acid etchant is buffered hydrofluoric acid.

The fifth aspect of the present invention is drawn to a specific embodiment of the method for producing an n-type Group III nitride semiconductor product according to any of the first to fourth aspects of the invention, wherein the third layer is formed so as to have a thickness of 50 nm or less.

The sixth aspect of the present invention is drawn to a specific embodiment of the method for producing an n-type Group III nitride semiconductor product according to the fifth aspect of the invention, wherein the third layer has an Si concentration of $1 \times 10^{19}/cm^3$ or more at any point in a thickness direction.

The seventh aspect of the present invention is drawn to a specific embodiment of the method for producing an n-type Group III nitride semiconductor product according to any of the first to sixth aspects of the invention, wherein forming another second layer of $SiO_2$ on the third layer which is seemed as another first layer; removing the another second layer by wet etching; and growing a Group III nitride semiconductor on the third layer exposed by removing the another second layer by MOCVD without supply of an n-type dopant gas, or with supply of an n-type dopant so that the Si concentration attributed to the n-type dopant is less than $1 \times 10^{19}/cm^3$, to thereby provide another third layer, continued to the third layer, formed of an n-type Group III nitride semiconductor doped with Si at a concentration of $1 \times 10^{19}/cm^3$ or more.

The eighth aspect of the present invention is drawn to a specific embodiment of the method for producing an n-type Group III nitride semiconductor product according to the seventh aspect of the invention, wherein forming and removing the another second layer and forming the third layer are repeated more than two times.

According to the present invention, without supply of an n-type dopant gas such as silane, the third layer can be formed of an n-type Group III nitride semiconductor having an Si concentration as high as $1 \times 10^{19}/cm^3$ or more and exhibiting favorable crystallinity. Also, in the case where an n-type dopant gas is supplied so that the Si concentration attributed to the dopant gas is less than $1 \times 10^{19}/cm^3$, the third layer can be formed of an n-type Group III nitride semiconductor having an Si concentration as high as $1 \times 10^{19}/cm^3$ or more and exhibiting favorable crystallinity. Conceivably, the reason why the third layer is of an n-type is attributed to the fact that Si remains on the top surface of the first layer after removal of the second layer formed of $SiO_2$, and the remaining Si diffuses in the third layer upon growth thereof on the first layer.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIGS. 2A and 2B are graphs showing Si concentration profiles as obtained by SIMS analysis.

DETAILED DESCRIPTION OF PREFERRED EMBODIMENTS

A specific embodiment of the present invention will next be described with reference to the drawings. However, the present invention is not limited to the embodiment.

Embodiment 1

Figure 1A:
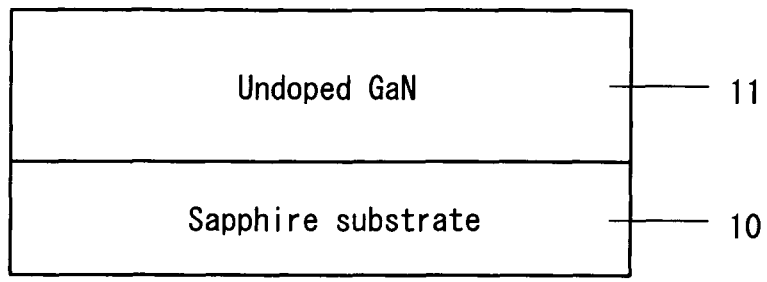
FIGS. 1A to 1D are sketches showing processes for producing n-type GaN according to Embodiment 1.

Firstly, a sapphire substrate 10 was placed in an MOCVD apparatus, and the sapphire substrate 10 was heated in a hydrogen atmosphere at 1,160° C. for thermal cleaning, followed by cooling to 400° C. An AlN buffer layer (not illustrated) was formed on the sapphire substrate 10 by MOCVD at 400° C. so as to have a thickness of 40 nm, and then a first layer 11 (thickness: 2 μm) was formed from undoped GaN on the buffer layer by MOCVD at 1,140° C. (FIG. 1A). The raw material gases employed for forming the buffer layer and the first layer 11 are as follows: TMG (trimethylgallium) as a Ga source, TMA (trimethylaluminum) as an Al source, and ammonia as a nitrogen source. Nitrogen and hydrogen were employed as carrier gases.

Figure 1B:
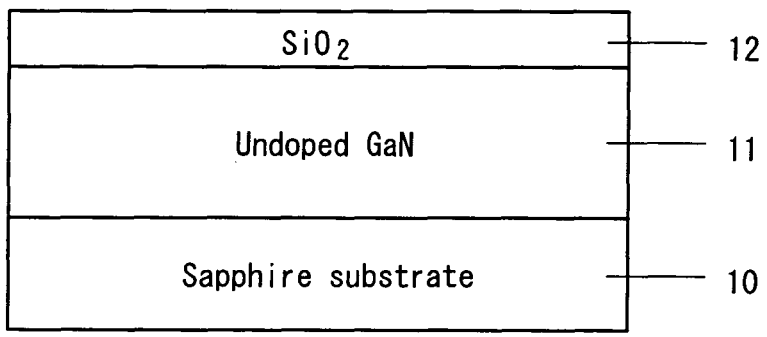

Subsequently, the resultant wafer was removed from the MOCVD apparatus, and then placed in a plasma CVD apparatus. A second layer 12 (thickness: 200 nm) was formed from $SiO_2$ on the first layer 11 by plasma CVD (FIG. 1B). Silane ($SiH_4$) and $N_2O$ were employed as raw material gases, and the substrate temperature was adjusted to 300° C.

The second layer 12 may be formed by, for example, a CVD technique other than plasma CVD, or sputtering.

Figure 1C:
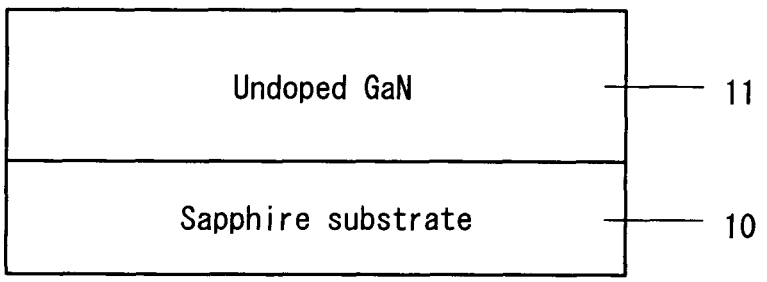

Next, the resultant wafer was removed from the plasma CVD apparatus, and the wafer was immersed in BHF (buffered hydrofluoric acid), to thereby remove the second layer 12 (FIG. 1C). This treatment was carried out for three minutes. A hydrofluoric acid etchant other than BHF may be employed.

Figure 1D:
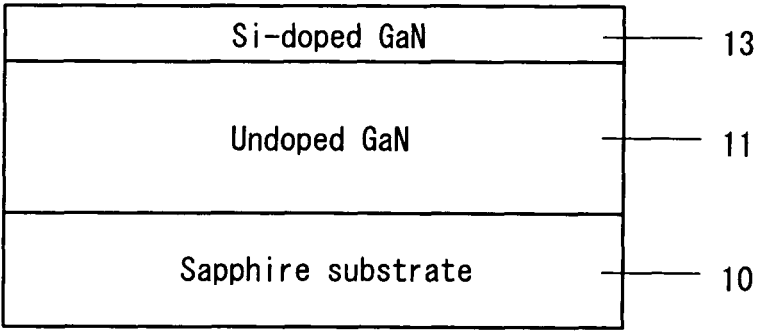

Then, the resultant wafer was placed in an MOCVD apparatus, and a GaN layer (thickness: 50 nm) was grown, by MOCVD at 1,140° C., on the first layer 11 exposed by removal of the second layer 12 without supply of an n-type dopant gas. The employed raw material gases and carrier gases were the same as those employed for formation of the first layer 11. Thus, on the first layer 11 was provided a third layer 13 formed of n-type GaN doped with Si at a high concentration and exhibiting favorable crystallinity (FIG. 1D). The third layer 13 was found to have an Si concentration of $1 \times 10^{19}/cm^3$ or more at any point in a thickness direction; i.e., the average of Si concentrations as measured in a thickness direction was $1 \times 10^{19}/cm^3$ or more.

Although the third layer 13 was grown without supply of an n-type dopant gas as described above, the layer was formed of n-type GaN doped with Si (i.e., n-type impurity). This is considered to be attributed to the fact that Si remains on the top surface of the first layer 11 after removal of the second layer formed of $SiO_2$ by use of BHF, and Si remaining on the top surface of the first layer 11 diffuses in the third layer 13 upon growth thereof on the first layer 11. Conceivably, when the thickness of the second layer is adjusted to a specific level or more, the amount of Si remaining on the top surface of the first layer 11 is saturated, and the amount of Si incorporated into the third layer 13 by doping is also saturated. Therefore, conceivably, the maximum amount of Si incorporated into the third layer 13 is limited, and the upper limit of the Si concentration of the third layer 13 is determined by the thickness of the third layer 13.

FIG. 2A is a graph showing the Si concentration profile of a sample corresponding to Embodiment 1 obtained by SIMS analysis. Generally, the outermost layer of a sample cannot be analyzed by SIMS analysis. Therefore, the sample of Embodiment 1 was prepared by further providing an AlGaN cap layer (thickness: 30 nm) on the third layer 13, so that the surface of the third layer 13 of the sample was analyzed. FIG. 2B is a graph showing the Si concentration profile of a comparative sample obtained by SIMS analysis. The comparative sample was prepared in a manner similar to that in Embodiment 1, in which a first layer formed of undoped GaN was provided on a sapphire substrate in an MOCVD apparatus; the resultant wafer was temporarily removed from the MOCVD apparatus and then again placed in the MOCVD apparatus; a third layer was formed on the first layer under the same conditions as those employed for forming the third layer 13 in Embodiment 1; and an AlGaN cap layer (thickness: 30 nm) was provided on the third layer. For preparation of the comparative sample, the wafer was temporarily removed from the MOCVD apparatus and then again placed in the MOCVD apparatus, so that effects on the wafer (e.g., incorporation of impurities contained in air) were the same as those in the case of Embodiment 1. That is, the comparative sample differs from the sample of Embodiment 1 only in that formation and removal of the second layer (i.e., the processes shown in FIGS. 1B and 1C) were not carried out. In each of the graphs of FIGS. 2A and 2B, the horizontal axis corresponds to depth as measured from the surface of the cap layer, and the vertical axis corresponds to Si concentration.

As shown in FIG. 2B, the third layer of the comparative sample, which was formed without supply of an n-type dopant, was found to have an Si concentration of $1\times10^{17}$ to $1\times10^{18}/cm^3$. Conceivably, the reason for this is attributed to the fact that, for example, Si contained in air was incorporated into the third layer upon removal of the wafer from the MOCVD apparatus after formation of the first layer.

As shown in FIG. 2A, the third layer 13 of the sample of Embodiment 1 has an Si concentration of about $1\times10^{19}/cm^3$ at a point in the vicinity of the top surface of the first layer 11, and the Si concentration of the third layer 13 increases as the thickness thereof (as measured from the top surface of the first layer 11) increases to 20 nm or thereabouts (the Si concentration is about $7\times10^{19}/cm^3$ at a thickness of 20 nm). The Si concentration decreases as the thickness increases from about 20 nm, and the Si concentration is about $1\times10^{19}/cm^3$ at the top surface of the third layer 13. As shown in FIG. 2A, the Si concentration profile of the third layer 13 with respect to the thickness thereof has a peak at a thickness of about 20 nm and assumes an upward convex shape, and the third layer 13 has an Si concentration of $1\times10^{19}/cm^3$ or more as measured at any point in a thickness direction. The third layer 13 has an average Si concentration of about $5\times10^{19}/cm^3$ in a thickness direction. Conceivably, since the amount of Si remaining on the top surface of the first layer 11 is saturated, the maximum amount of Si incorporated into the third layer 13 is limited, and the upper limit of the Si concentration of the third layer 13 depends on the thickness thereof. This conception and the Si concentration profile shown in FIG. 2A together suggest that when the thickness of the third layer 13 is adjusted to 100 nm or less, the average Si concentration of the third layer 13 can be regulated to $1\times10^{19}/cm^3$ or more in a thickness direction, and the third layer 13 has a peak Si concentration of $1\times10^{20}/cm^3$ or less and an average Si concentration of $1\times10^{20}/cm^3$ or less in a thickness direction.

Comparison between FIGS. 2A and 2B shows that the factor contributing to high-concentration Si doping of the third layer 13 is formation and removal of the second layer 12 by the processes of FIGS. 1B and 1C in Embodiment 1.

In Embodiment 1, each of the first layer 11 and the third layer 13 was formed of GaN. However, the present invention is not limited thereto. So long as each of the first layer 11 and the third layer 13 is formed of a Group III nitride semiconductor, these layers may have the same composition or different compositions. Therefore, the present invention can be applied to, for example, the case where the first layer 11 is formed of GaN and the third layer 13 is formed of AlGaN, or the case where the first layer 11 is formed of InGaN and the third layer 13 is formed of GaN.

In Embodiment 1, the first layer 11 was formed of undoped GaN. However, the first layer 11 may be formed of GaN doped with an n-type impurity such as Si, or GaN doped with a p-type impurity such as Mg.

The thickness of the third layer 13 may be further increased by repeatedly carrying out the corresponding processes in Embodiment 1.

In Embodiment 1, the third layer was formed by MOCVD without supply of silane. However, in the case of formation of the third layer, silane may be supplied so that the Si concentration attributed to silane is less than $1\times10^{19}/cm^3$. In this case, similar to the case of Embodiment 1, the third layer formed of n-type GaN has an Si concentration of $1\times10^{19}/cm^3$ or more and exhibits excellent crystallinity.

The n-type Group III nitride semiconductor product produced by the method of the present invention has a high Si concentration and exhibits favorable crystallinity. Therefore, the n-type Group III nitride semiconductor product is suitable for use in, for example, a contact layer for an electrode of a Group III nitride semiconductor device. For example, the n-type Group III nitride semiconductor product can be employed in a contact layer for a source electrode or drain electrode of, for example, an HFET, to thereby reduce the contact resistance of the source electrode or the drain electrode.

What is claimed is:

1. A method for producing an n-type Group III nitride semiconductor product, the method comprising:
   forming a second layer of $SiO_2$ on a first layer of a Group III nitride semiconductor;
   removing the second layer by wet etching; and
   growing a Group III nitride semiconductor on the first layer exposed by removing the second layer by MOCVD without supply of an n-type dopant gas, or with supply of an n-type dopant so that a Si concentration attributed to the n-type dopant is less than $1\times10^{19}/cm^3$, to thereby provide a third layer formed of an n-type Group III nitride semiconductor doped with Si at a concentration of $1\times10^{19}/cm^3$ or more.

2. A method for producing an n-type Group III nitride semiconductor product according to claim 1, wherein the second layer is formed by plasma CVD.

3. A method for producing an n-type Group III nitride semiconductor product according to claim 1, wherein wet etching of the second layer is carried out by a hydrofluoric acid etchant.

4. A method for producing an n-type Group III nitride semiconductor product according to claim 2, wherein wet etching of the second layer is carried out by a hydrofluoric acid etchant.

5. A method for producing an n-type Group III nitride semiconductor product according to claim 3, wherein the hydrofluoric acid etchant comprises buffered hydrofluoric acid.

6. A method for producing an n-type Group III nitride semiconductor product according to claim 4, wherein the hydrofluoric acid etchant comprises buffered hydrofluoric acid.

7. A method for producing an n-type Group III nitride semiconductor product according to claim 1, wherein the third layer is formed so as to have a thickness of 50 nm or less.

8. A method for producing an n-type Group III nitride semiconductor product according to claim 2, wherein the third layer is formed so as to have a thickness of 50 nm or less.

9. A method for producing an n-type Group III nitride semiconductor product according to claim 3, wherein the third layer is formed so as to have a thickness of 50 nm or less.

10. A method for producing an n-type Group III nitride semiconductor product according to claim 1, further comprising:
    forming another second layer of $SiO_2$ on the third layer which is seemed as another first layer;
    removing the another second layer by wet etching; and
    growing a Group III nitride semiconductor on the third layer exposed by removing the another second layer by MOCVD without supply of an n-type dopant gas, or with supply of an n-type dopant so that the Si concentration attributed to the n-type dopant is less than $1\times10^{19}/cm^3$, to thereby provide another third layer, continued to the third layer, comprising an n-type Group III nitride semiconductor doped with Si at a concentration of $1\times10^{19}/cm^3$ or more.

11. A method for producing an n-type Group III nitride semiconductor product according to claim 2, further comprising:
    forming another second layer of $SiO_2$ on the third layer which is seemed as another first layer;

removing the another second layer by wet etching; and growing a Group III nitride semiconductor on the third layer exposed by removing the another second layer by MOCVD without supply of an n-type dopant gas, or with supply of an n-type dopant so that the Si concentration attributed to the n-type dopant is less than $1\times10^{19}/cm^3$, to thereby provide another third layer, continued to the third layer, comprising an n-type Group III nitride semiconductor doped with Si at a concentration of $1\times10^{19}/cm^3$ or more.

12. A method for producing an n-type Group III nitride semiconductor product according to claim 3, further comprising:

forming another second layer of $SiO_2$ on the third layer which is seemed as another first layer;

removing the another second layer by wet etching; and growing a Group III nitride semiconductor on the third layer exposed by removing the another second layer by MOCVD without supply of an n-type dopant gas, or with supply of an n-type dopant so that the Si concentration attributed to the n-type dopant is less than $1\times10^{19}/cm^3$, to thereby provide another third layer, continued to the third layer, comprising an n-type Group III nitride semiconductor doped with Si at a concentration of $1\times10^{19}/cm^3$ or more.

13. A method for producing an n-type Group III nitride semiconductor product according to claim 7, further comprising:

forming another second layer of $SiO_2$ on the third layer which is seemed as another first layer;

removing the another second layer by wet etching; and growing a Group III nitride semiconductor on the third layer exposed by removing the another second layer by MOCVD without supply of an n-type dopant gas, or with supply of an n-type dopant so that the Si concentration attributed to the n-type dopant is less than $1\times10^{19}/cm^3$, to thereby provide another third layer having a thickness of 50 nm or less, continued to the third layer, comprising an n-type Group III nitride semiconductor doped with Si at a concentration of $1\times10^{19}/cm^3$ or more.

14. A method for producing an n-type Group III nitride semiconductor product according to claim 10, wherein said forming the another second layer and said removing the another second layer and forming the third layer are repeated more than two times.

15. A method for producing an n-type Group III nitride semiconductor product according to claim 11, wherein said forming the another second layer and said removing the another second layer and forming the third layer are repeated more than two times.

16. A method for producing an n-type Group III nitride semiconductor product according to claim 12, wherein said forming the another second layer and said removing the another second layer and forming the third layer are repeated more than two times.

17. A method for producing an n-type Group III nitride semiconductor product according to claim 13, wherein said forming the another second layer and said removing the another second layer and forming the third layer are repeated more than two times.

* * * * *